US010587254B2

(12) United States Patent
Park et al.

(10) Patent No.: US 10,587,254 B2
(45) Date of Patent: Mar. 10, 2020

(54) APPARATUS AND METHOD FOR CONTROLLING ALTERNATOR OF VEHICLE

(71) Applicants: HYUNDAI MOTOR COMPANY, Seoul (KR); KIA MOTORS CORPORATION, Seoul (KR); HYUNDAI AUTRON CO., LTD., Seongnam-si, Gyeonggi-do (KR)

(72) Inventors: ChoongSeob Park, Suwon-si (KR); Dongju Lee, Suwon-si (KR); SangHyun Jang, Yongin-si (KR); Deok Joo Lee, Seoul (KR); Myoung Kwan Kim, Seoul (KR)

(73) Assignees: HYUNDAI MOTOR COMPANY, Seoul (KR); KIA MOTORS CORPORATION, Seoul (KR); HYUNDAI AUTRON CO., LTD., Seongnam-si (KR)

( * ) Notice: Subject to any disclaimer, the term of this patent is extended or adjusted under 35 U.S.C. 154(b) by 0 days.

(21) Appl. No.: 15/963,807

(22) Filed: Apr. 26, 2018

(65) Prior Publication Data
US 2019/0165773 A1    May 30, 2019

(30) Foreign Application Priority Data
Nov. 30, 2017   (KR) .......................... 10-2017-0162449

(51) Int. Cl.
*H03K 5/156* (2006.01)
*H02J 7/00* (2006.01)
(Continued)

(52) U.S. Cl.
CPC ............ *H03K 5/1565* (2013.01); *H02J 7/007* (2013.01); *H02P 9/107* (2013.01); *H02P 9/48* (2013.01);
(Continued)

(58) Field of Classification Search
CPC combination set(s) only.
See application file for complete search history.

(56) References Cited

U.S. PATENT DOCUMENTS 2,886,763 A * 5/1959 Zelina ...................... H02P 9/34
322/25
4,275,344 A * 6/1981 Mori ....................... H02J 7/245
320/123
(Continued)

FOREIGN PATENT DOCUMENTS

JP          5405697 B1     2/2014
JP       2014-176179 A     9/2014
(Continued)

*Primary Examiner* — Tulsidas C Patel
*Assistant Examiner* — Joseph Ortega
(74) *Attorney, Agent, or Firm* — Knobbe Martens Olson & Bear LLP

(57) ABSTRACT

Disclosed is a method for controlling an alternator of a vehicle that can change a Pulse Width Modulation (PWM) duty cycle change rate to reach a target PWM duty cycle after completion of an initial engine stabilization. According to the method, PWM duty cycle is increased using an initial rate received from an ECU to prevent an engine overload from occurring when a current PWM duty cycle is less than a predetermined reference duty cycle. When the current PWM duty cycle becomes higher than the predetermined reference duty cycle, PWM duty cycle change rate can be adjusted to flexibly suppress engine RPM fluctuation and vibration in real time and to improve a response speed of an alternator output voltage.

14 Claims, 9 Drawing Sheets

(51) Int. Cl.
*H02P 29/02* (2016.01)
*H02P 9/10* (2006.01)
*H03K 7/08* (2006.01)
*H02P 9/48* (2006.01)
*H02P 9/30* (2006.01)
*H02P 101/45* (2016.01)

(52) U.S. Cl.
CPC ............... *H02P 29/02* (2013.01); *H03K 7/08* (2013.01); *H02P 9/30* (2013.01); *H02P 2101/45* (2015.01)

(56) References Cited

U.S. PATENT DOCUMENTS

| | | | | |
|---|---|---|---|---|
| 4,533,863 A * | 8/1985 | Luhn | .................. | H02P 9/305 322/28 |
| 4,777,425 A * | 10/1988 | MacFarlane | .............. | H02P 9/04 322/25 |
| 5,734,147 A * | 3/1998 | Bunker | ................ | B23K 9/1006 219/130.33 |
| 5,814,788 A * | 9/1998 | Everhart | .............. | B23K 9/1043 219/130.33 |
| 7,629,705 B2 * | 12/2009 | Barker | .................... | H02P 9/007 290/55 |
| 8,442,718 B2 * | 5/2013 | Ahn | ........................ | B60L 58/12 701/36 |
| 9,168,918 B2 * | 10/2015 | Lee | ........................ | B60W 20/30 |
| 9,337,761 B1 * | 5/2016 | Seidl | ......................... | H02P 9/48 |
| 9,391,548 B2 * | 7/2016 | Park | ......................... | H02P 6/14 |
| 2003/0039130 A1 * | 2/2003 | Curtiss | .................... | G05F 1/613 363/37 |
| 2003/0075997 A1 * | 4/2003 | Keim | ........................ | B60L 15/007 310/68 D |
| 2005/0146308 A1 * | 7/2005 | Quazi | ...................... | H02M 7/2176 322/28 |
| 2008/0191675 A1 * | 8/2008 | Besser | ................. | H02J 7/0068 323/282 |
| 2009/0216415 A1 * | 8/2009 | Iwatsuki | ............. | B60W 30/188 701/70 |
| 2010/0032964 A1 * | 2/2010 | Hoffmann | ............... | F01D 15/10 290/40 B |
| 2010/0244787 A1 * | 9/2010 | Auer | ........................ | H02P 9/48 322/28 |
| 2011/0018478 A1 * | 1/2011 | Kobayashi | ........ | H02M 7/53873 318/257 |
| 2011/0101928 A1 * | 5/2011 | Kamimura | .............. | H02P 9/107 322/24 |
| 2013/0068204 A1 * | 3/2013 | Trecarichi | ............. | F02P 3/0435 123/594 |
| 2013/0069570 A1 * | 3/2013 | Chen | ....................... | B60L 3/003 318/400.09 |
| 2013/0307489 A1 * | 11/2013 | Kusch | ..................... | B60L 58/26 320/162 |
| 2014/0333270 A1 * | 11/2014 | Young | ....................... | G05F 1/12 323/234 |
| 2015/0260143 A1 * | 9/2015 | Yorke | ................. | F02N 11/0822 701/112 |
| 2016/0082862 A1 * | 3/2016 | Cho | ........................ | B60W 20/00 701/22 |
| 2016/0209861 A1 * | 7/2016 | Choi | ........................ | G05F 3/267 |
| 2017/0036671 A1 * | 2/2017 | Fukuchi | ................. | B60W 20/20 |
| 2017/0123754 A1 * | 5/2017 | Kwon | .................... | G05B 15/02 |
| 2017/0144650 A1 * | 5/2017 | Nagamiya | ............. | B60W 20/12 |
| 2017/0327001 A1 * | 11/2017 | Lu | ............................ | B60L 3/003 |
| 2017/0346428 A1 * | 11/2017 | Tisserand | ................ | F02D 29/02 |
| 2018/0069496 A1 * | 3/2018 | Mizuo | ....................... | H02P 7/02 |
| 2018/0287601 A1 * | 10/2018 | Yang | ......................... | H02J 50/12 |
| 2018/0366970 A1 * | 12/2018 | Zhou | ......................... | H02M 1/08 |

FOREIGN PATENT DOCUMENTS

| JP | 2015-50815 A | 3/2015 |
|---|---|---|
| KR | 10-2014-0066055 A | 5/2014 |
| KR | 10-1518486 B1 | 5/2015 |

\* cited by examiner

APPARATUS AND METHOD FOR CONTROLLING ALTERNATOR OF VEHICLE

CROSS-REFERENCE TO RELATED APPLICATION

This application claims the benefit of Korean Patent Application No. 10-2017-0162449, filed on Nov. 30, 2017 in the Korean Intellectual Property Office, the disclosure of which is incorporated herein by reference.

BACKGROUND

1. Field

Embodiments of the present disclosure relate to an apparatus and method for controlling an alternator of a vehicle.

2. Description of the Related Art

Generally, various electronic devices are mounted in a vehicle such that the region occupied by the electronic devices within an interior space of the vehicle is rapidly increasing in size. Due to the increasing number of electronic devices embedded in the vehicle, various kinds of power generation control systems for improving fuel efficiency of the vehicle have been developed, and many developers and companies are conducting intensive research into alternator power generation control logics capable of generating electricity and power using rotational power of a vehicle engine.

The alternator is embedded in a vehicle to charge an in-vehicle battery, so that the alternator may produce power consumed to drive the vehicle. The alternator includes an AC generator for generating electricity and power, a rectifier for rectifying the electricity and power, a regulator for controlling a voltage, etc. The regulator may compare a target voltage with a current output voltage of the alternator, and may determine a target PWM duty cycle of an output current applied to a rotor electromagnet of an AC generator, such that a DC voltage of the alternator can be constantly maintained at the target voltage received from an electronic control unit (ECU).

Therefore, the regulator may receive an arrival speed (slope) ranging from the current PWM duty cycle to the target PWM duty cycle from the ECU, may change the current PWM duty cycle according to the arrival speed (slope), and may thus control the amount of current applied to the rotor electromagnet.

However, when the arrival speed (slope) received from the ECU is selected once, in a related art, a alternator regulator cannot change the slope in so far as the target duty cycle is not changed, such that the alternator regulator cannot change the speed arriving at a target voltage and at the same time cannot improve a response speed of the alternator output voltage.

The disclosure of this section is to provide background of the invention. Applicant notes that this section may contain information available before this application. However, by providing this section, Applicant does not admit that any information contained in this section constitutes prior art.

SUMMARY

Therefore, it is an aspect of the present disclosure to provide an apparatus and method for controlling an alternator of a vehicle so as to change a slope of a target PWM duty cycle according to lapse of time after completion of initial engine stabilization.

Additional aspects of the invention will be set forth in part in the description which follows and, in part, will be obvious from the description, or may be learned by practice of the invention.

In accordance with an aspect of the present disclosure, an apparatus for controlling an alternator of a vehicle includes: an alternator configured to generate electricity using rotational force of an engine; and a regulator configured to control a current output voltage of the alternator at a target voltage. The regulator includes: a duty determiner configured to determine a target PWM duty cycle by calculating a difference between the target voltage and a voltage of the alternator; and a slope controller configured to control a slope indicating a speed arriving at the target PWM duty cycle at a current PWM duty cycle.

The slope controller may change a PWM duty slope of the regulator according to lapse of time.

The slope controller may receive a threshold duty cycle capable of changing the slope and a real-time slope value from an electronic control unit (ECU) through Local Interconnect Network (LIN) communication.

The slope controller may change a current PWM duty cycle according to the slope value received from the ECU.

The slope controller may compare the current PWM duty cycle with the threshold duty cycle duty cycle, and may use an initially-established slope received from the ECU when the current PWM duty cycle is less than the threshold duty cycle.

The slope controller may change a final PWM duty cycle outputting a current applied to a rotor electromagnet, using the initially-established slope.

The slope controller may compare the current PWM duty cycle with the threshold duty cycle, and may change the slope when the current PWM duty cycle is higher than the threshold duty cycle.

The slope controller may change a final PWM duty cycle outputting a current applied to a rotor electromagnet, using the changed slope.

The slope controller may receive a plurality of slope values from the ECU, and may change a PWM duty cycle according to the received slope values in real time.

The slope controller may output a current applied to a rotor electromagnet by controlling an output PWM duty cycle according to the slope.

In accordance with another aspect of the present disclosure, an apparatus for controlling an alternator of a vehicle includes: an alternator configured to provide a battery and at least one electronic device with a voltage using rotational force of an engine; and a regulator configured to control an output voltage of the alternator at a target voltage. The regulator determines a target PWM duty cycle by calculating a difference between the target voltage and a voltage of the alternator, and variably controls a slope indicating a speed arriving at the target PWM duty cycle at a current PWM duty cycle.

The regulator may receive a real-time slope value and a threshold duty cycle capable of changing the slope from an electronic control unit (ECU), and may thus change a final PWM duty cycle outputting a current applied to a rotor electromagnet.

The regulator may compare a current PWM duty cycle with the threshold duty cycle, and may change the current PWM duty cycle using an initially-established slope received from the ECU when the current PWM duty cycle is less than the threshold duty cycle.

The slope controller may compare a current PWM duty cycle with the threshold duty cycle, and may change the slope when the current PWM duty cycle is higher than the threshold duty cycle so that the current PWM duty cycle is changed in real time according to the changed slope.

The slope controller may change the final PWM duty cycle using the real-time changing slope.

In accordance with another aspect of the present disclosure, a method for controlling an alternator of a vehicle configured to generate electricity using rotational force of an engine includes: receiving a target voltage from an electronic control unit (ECU); determining a target PWM duty cycle by comparing a current output voltage of the alternator with the target voltage; receiving a threshold duty cycle from the ECU; comparing a current PWM duty cycle with the threshold duty cycle; and controlling a slope indicating a speed arriving at the target PWM duty cycle when the current PWM duty cycle is higher than the threshold duty cycle.

The threshold duty cycle may be a threshold value for changing a slope of the current PWM duty cycle according to a slope value received from the ECU.

The controlling the slope may include changing the slope of the current PWM duty cycle according to lapse of time.

The method may further include arriving at the target PWM duty cycle using the slope changed according to lapse of time.

The method may further include, when the current PWM duty cycle is less than the threshold duty cycle, arriving at the target PWM duty cycle using an initially-established slope from the ECU.

BRIEF DESCRIPTION OF THE DRAWINGS

These and/or other aspects of the invention will become apparent and more readily appreciated from the following description of embodiments, taken in conjunction with the accompanying drawings of which.

DETAILED DESCRIPTION

Figure 1:
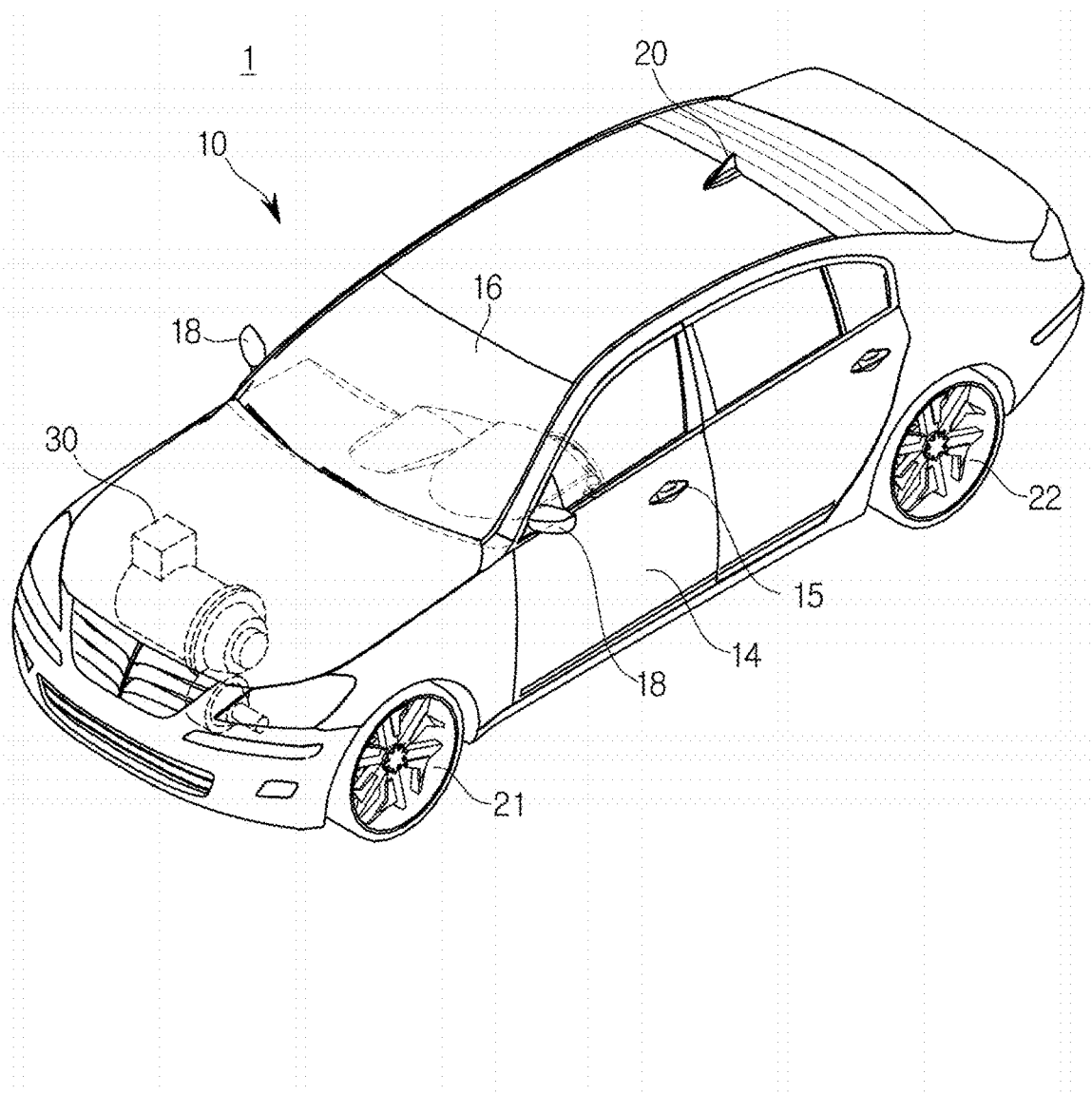
FIG. 1 is a view illustrating the appearance of a vehicle according to an embodiment of the present disclosure.

Reference will now be made in detail to certain embodiments of the present disclosure, examples of which are illustrated in the accompanying drawings, wherein like reference numerals refer to like elements throughout.

The terms used in the present application are merely used to describe specific embodiments and are not intended to limit the present disclosure. A singular expression may include a plural expression unless otherwise stated in the context. In the present application, the terms "including" or "having" are used to indicate that features, numbers, steps, operations, components, parts or combinations thereof described in the present specification are present and presence or addition of one or more other features, numbers, steps, operations, components, parts or combinations is not excluded.

In description of the present disclosure, the terms "first" and "second" may be used to describe various components, but the components are not limited by the terms. The terms may be used to distinguish one component from another component. For example, a first component may be called a second component and a second component may be called a first component without departing from the scope of the present disclosure. The term "and/or" may include a combination of a plurality of items or any one of a plurality of items.

An apparatus and method for controlling an alternator of a vehicle according to an embodiment of the present disclosure will hereinafter be described with reference to the attached drawings.

An aspect of the invention provides a method for controlling an alternator of a vehicle. At least one controller (ECU) of a vehicle sets a target pulse-width modulation (PWM) duty cycle according to operation of vehicle. After the target PWM duty cycle is set, the controller determines an initial rate of PWM duty cycle change (FIG. 6, slope 5) such that the alternator increases PWM duty cycle linearly from the current PWN duty cycle using the initial rate. When the target PWM duty cycle is updated, the rate of PWM duty cycle change is updated accordingly such that alternator increases PWM duty cycle linearly to the updated target PWM duty cycle using the updated rate.

In embodiments, subsequent to increasing PWM duty cycle the initial rate, the controller increases the rate of PWM duty cycle change even when the target pulse-width modulation (PWM) duty cycle remains the same. (FIG. 5, slope 3, slope 1) In embodiments, the rate of PWM duty cycle change is adjusted only when the engine is stabilized after a cold start of the engine while the target pulse-width modulation remains the same. In embodiments, the controller determines the engine is stabilized when revolutions per minute (RPM) of the engine reaches to a level of a predetermined RPM for engine idling after RPM of the engine has been increased after a cold start over the predetermined RPM for engine idling to heat the engine. In embodiments, the controller determines the engine is stabilized when RPM of the engine is maintained at a level of a predetermined RPM longer than a reference time. In embodiments, the predetermined RPM for engine idling corresponds to the slope variable threshold.

FIG. 1 is a view illustrating the appearance of a vehicle 1 according to an embodiment of the present disclosure.

Referring to FIG. 1, the vehicle 1 according to a certain embodiment includes a body 10 forming the appearance of the vehicle 1, doors 14 to shield an indoor space of the vehicle 1 from the outside, a vehicle windshield 16 to provide a forward view of the vehicle 1 to a vehicle driver who rides in the vehicle 1, side-view mirrors 18 to provide a rear view of the vehicle 1 to the vehicle driver, vehicle wheels 21 and 22 to move the vehicle 1 from place to place, a drive device (not shown) to rotate the vehicle wheels 21 and 22.

The doors 14 are rotatably provided at the right and left sides of the body 10 so that a vehicle driver can ride in the vehicle 1 when any of the doors 14 is open and an indoor space of the vehicle 1 can be shielded from the outside when the doors 14 are closed. The doors 14 may be locked or unlocked by door handles 15. The door handles 15 may be locked or unlocked by the vehicle driver who directly operates a button or lever by approaching the vehicle 1, or may be remotely locked or unlocked by a remote controller, etc. at a remote site distant from the vehicle 1.

The windshield 16 is provided at a front upper portion of the body 10 so that a vehicle driver who rides in the vehicle 1 can obtain visual information of a forward direction of the vehicle 1. The windshield 16 may also be referred to as a windshield glass.

The side-view mirrors 18 may include a left side-view mirror provided at the left of the body 10 and a right side-view mirror provided at the right of the body 10, so that the driver who rides in the vehicle 1 can obtain visual information of the lateral and rear directions of the vehicle 1.

Besides, the vehicle 1 may include an antenna 20 provided at a top surface of the body 10.

The antenna 20 may receive broadcast/communication signals, for example, telematics signal, DMB signal, digital TV signal, GPS signal, etc. The antenna 20 may be a multi-functional antenna configured to receive various kinds of broadcast/communication signals, or may be a single functional antenna configured to receive any one of broadcast/communication signals.

The wheels 21 and 22 may include front wheels 21 provided at the front of the body 10 and rear wheels 22 provided at the rear of the body 10. The drive device 30 may provide rotational force to the front wheels 21 or the rear wheels 22 in a manner that the body 10 moves forward or backward. The drive device 24 may include an engine 300 (see FIG. 3) to generate rotational force by burning fossil fuels or a motor to generate rotational force upon receiving power from a battery 310 (see FIG. 3).

The vehicle 1 according to one embodiment may be an electric vehicle (EV), a hybrid electric vehicle (HEV), or a fuel cell electric vehicle (FCEV).

Figure 2:
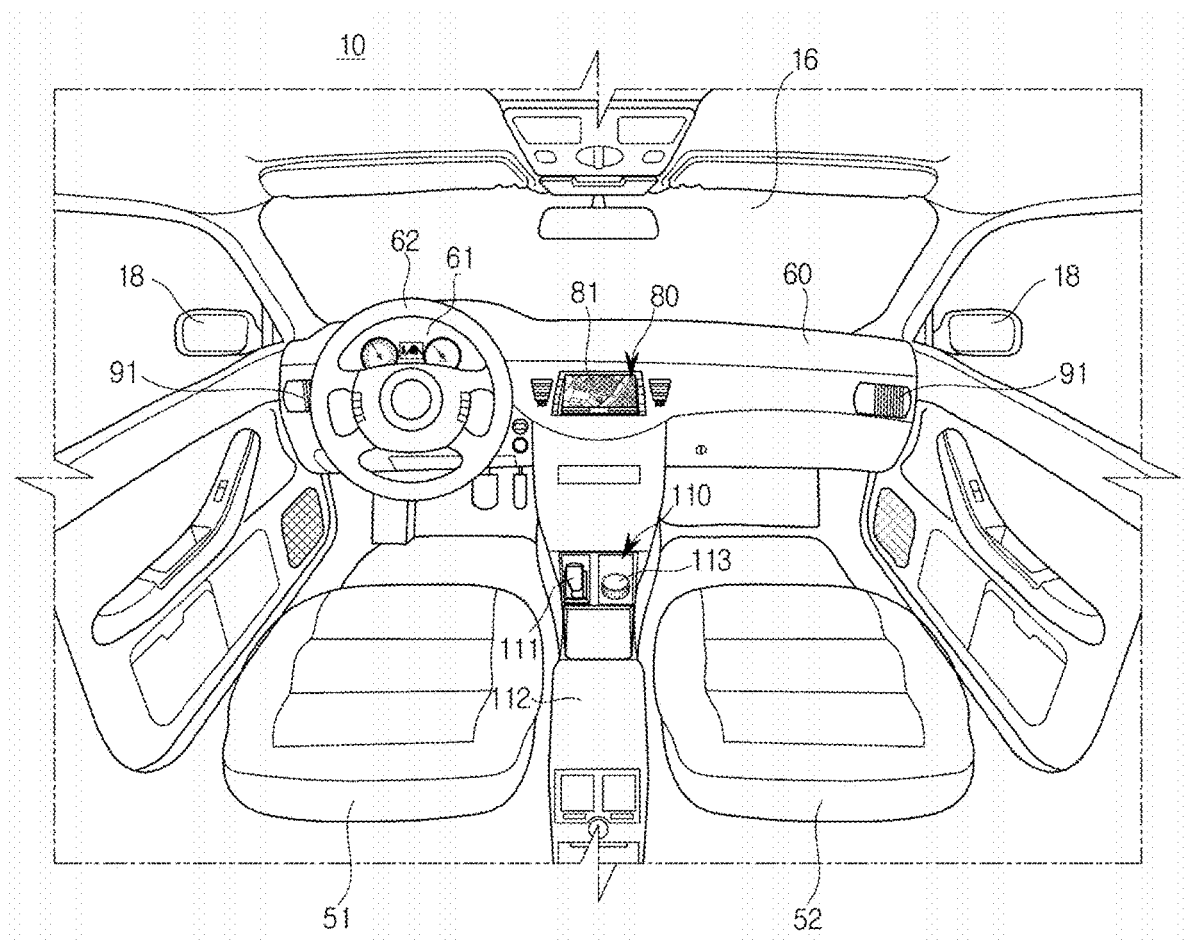
FIG. 2 is a view illustrating the internal structure of the vehicle according to an embodiment of the present disclosure.

FIG. 2 is a view illustrating the internal structure of the vehicle 1 according to an embodiment of the present disclosure.

Referring to FIG. 2, the indoor space of the vehicle 1 may include seats 51 and 52 on which passengers of the vehicle 1 sit, a steering wheel 62 mounted to the driver seat 51 on which a driver from among the passengers sits, a cluster 61 mounted to a front portion of the body 10 from the steering wheel 62 and displaying operation information of the vehicle 1, and a dashboard 60 to which various devices connected to the cluster 61 to manipulate the vehicle 1 are mounted.

In more detail, the dashboard 60 may protrude from a lower portion of the windshield 16 toward the seats 51 and 52, such that the vehicle driver who looks forward can manipulate various devices mounted to the dashboard 60.

For example, various devices mounted to the dashboard 60 may include an Audio Video Navigation (AVN) device 80 mounted to a center fascia corresponding to the center region of the dashboard 60, an air outlet 91 of an air conditioner (not shown) mounted to a side surface of a touchscreen 81 of the AVN device 80, and various input devices mounted to a lower portion of the AVN device 80.

The AVN device 80 may perform an audio function, a video function, and a navigation function according to manipulation of the passenger, and may be connected to a controller (i.e., a head unit) for controlling the vehicle 1.

The AVN device 80 may also perform two or more functions as necessary. For example, the AVN device 80 may reproduce music recorded on a CD or USB by turning on the audio function, and at the same time may perform the navigation function. In addition, the AVN device 80 may display DMB images by turning on the video function, and at the same time may perform the navigation function.

The AVN device 80 may display a screen image related to the audio function, a screen image related to the video function, or a screen image related to the navigation function on the touchscreen 81. The touchscreen 81 may display a charging state of the electric vehicle 1.

The touchscreen 81 may be implemented by any one of a Liquid Crystal Display (LCD) panel, a Light Emitting Diode (LED) panel, an Organic Light Emitting Diode (OLED) panel, etc. without being limited thereto. The touchscreen 81 may perform a screen display function and an input function of instructions or commands.

The touchscreen 81 may output a screen image including predetermined images to the outside according to an operating system (OS) for driving/controlling the AVN device 80 and an application being executed in the AVN device 80, or may receive instructions or commands.

The touchscreen 81 may display a basic screen image according to the executed application. If touch manipulation is not performed, the touchscreen 81 may display the basic screen image.

The touchscreen 81 may also display a touch manipulation screen image according to situations. The touch manipulation screen may indicate a screen image capable of receiving the user's touch manipulation.

The touchscreen 81 may be any one of a resistive touchscreen which senses the user's touch manipulation by recognizing pressure, a capacitive touchscreen which senses the user's touch manipulation based on the effect of capacitive coupling, an optical touchscreen based on infrared light, or an ultrasonic touchscreen which uses ultrasound, without being limited thereto.

The touchscreen 81 may control the AVN device 80 embedded in the vehicle 1 to interact with the user, and may receive a user command through touch interaction or the like. Since characters or menus displayed on the touchscreen 81 are selected, the touchscreen 81 may receive a user command as an input.

In this case, the AVN device 80 may be referred to as a navigation terminal or a display device, and may also be referred to by various terms well known to those skilled in the art as necessary.

In addition, the AVN device 80 may include a Universal Serial Bus (USB) port, and the like, may be connected to communication terminals, for example, a smartphone, a Portable Multimedia Player (PMP), an MPEG Audio Layer-3 (MP3) player, a Personal Digital Assistants (PDA), etc., and may reproduce audio and video files as necessary.

The air outlet 91 of the air conditioner (not shown) may be provided to both sides of the touchscreen 81 of the dashboard 60. The air conditioner may automatically control the air-conditioning environment (including indoor/outdoor environmental conditions of the vehicle 1, air intake/exhaust process, air circulation, cooling/heating, etc.), or may control the air-conditioning environment in response to a control command of the user.

For example, the air conditioner may perform heating and cooling of the air, and may discharge the heated or cooled air through the air outlet 91, thereby controlling a temperature of the indoor space of the vehicle 1.

The driver or passenger may control the air conditioner to adjust the temperature of the internal space of the body 10, before the driver or passenger gets in the vehicle 1.

Meanwhile, the interior part of the vehicle 1 may include a center console 110 disposed between the seats 51 and 52, and a tray 112 connected to the center console 110. The center console 110 may include a gear lever 111 and a jog-wheel or various key-types of input buttons 113, without being limited thereto.

Figure 3:
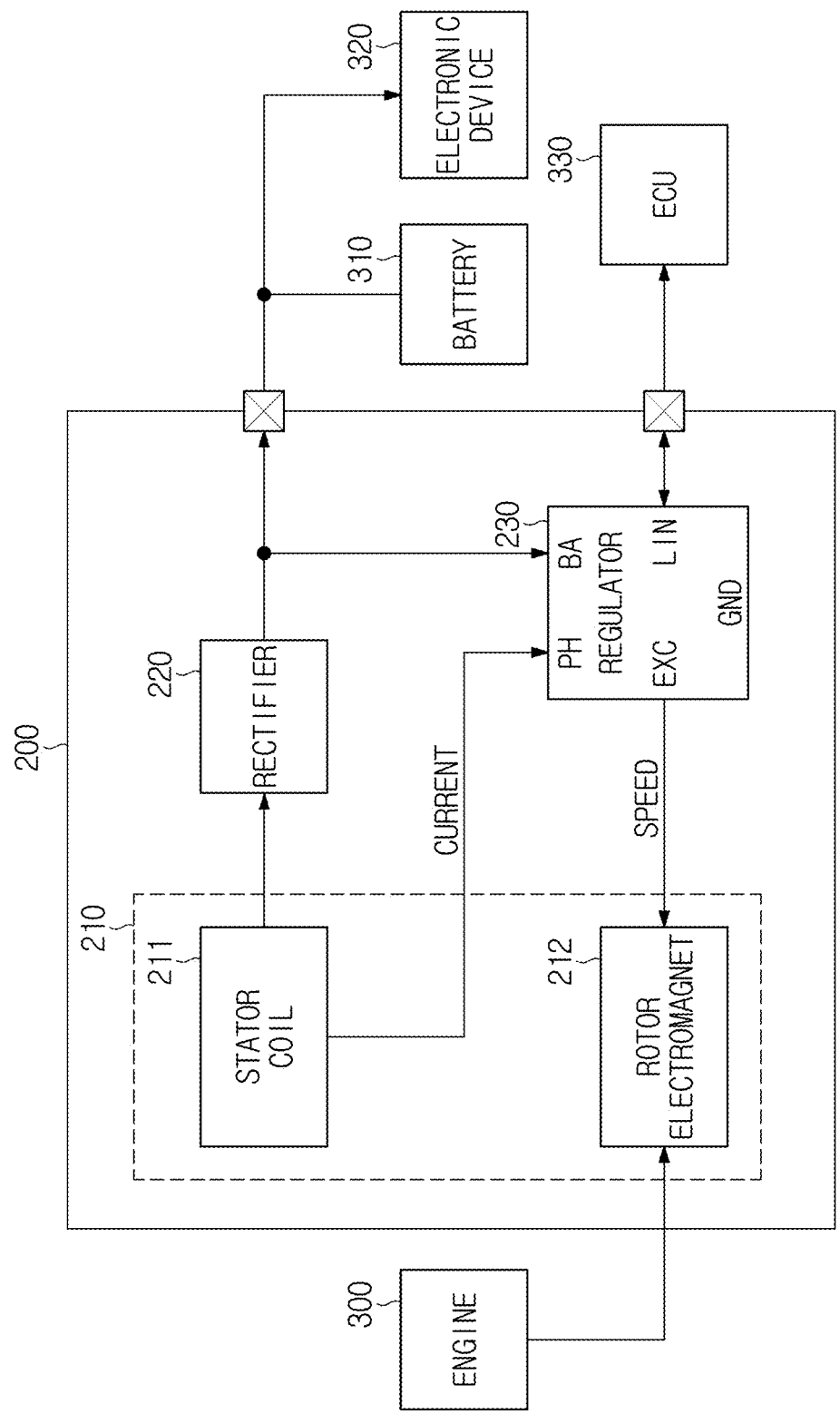
FIG. 3 is a block diagram illustrating an alternator for a vehicle according to an embodiment of the present disclosure.

FIG. 3 is a block diagram illustrating an alternator for a vehicle according to an embodiment of the present disclosure.

Referring to FIG. 3, a vehicle alternator 200 may provide a constant DC voltage and DC current to a battery 310 and at least one electronic device 320 using rotational power of the engine 300, and may include an AC generator 210, a rectifier 220, a regulator semiconductor 230 (hereinafter referred to as a regulator), etc.

The AC generator 210 may include a stator coil 211 and a rotor electromagnet 212 surrounding the stator coil 211. The AC generator 210 may generate an AC voltage by rotating the rotor electromagnet 212 through rotational power of the engine 300.

The rectifier 220 may rectify the AC voltage generated by the AC generator 210 into a DC voltage.

The regulator 230 may control the amount of current applied to the rotor electromagnet 212 so as to constantly maintain the DC voltage of the alternator 200 at a target voltage received through Local Interconnect Network (LIN) communication from the ECU 330. Magnetic force of the rotor electromagnet 212 may be proportional to the amount of input current applied to the rotor electromagnet 212. The ECU 330 may output a target linear voltage to the regulator 230 according to a pulse width modulation (PWM) scheme, the regulator 230 may control a target voltage value received by the ECU 330, and may transmit an alternator load signal to the ECU 330.

Figure 4:
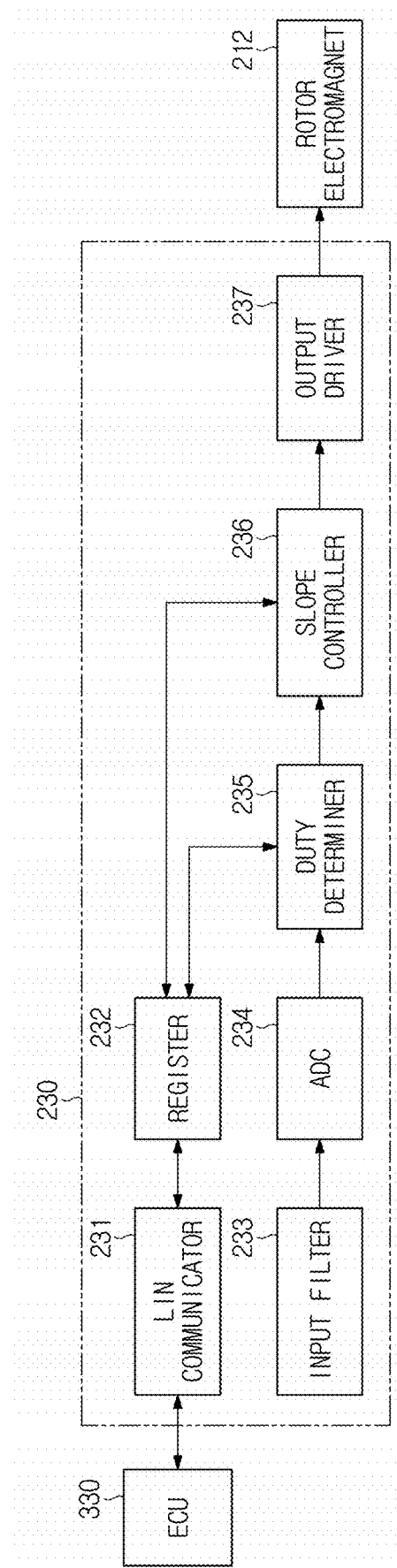
FIG. 4 is a block diagram illustrating an alternator regulator for a vehicle according to an embodiment of the present disclosure.

FIG. 4 is a block diagram illustrating an alternator regulator for a vehicle according to an embodiment of the present disclosure.

Referring to FIG. 4, the regulator 230 may further include a Local Interconnect Network (LIN) communicator 231, a register 232, an input filter 233, an Analog-to-Digital Converter (ADC) 234, a duty determiner 235, a slope controller 236, and an output driver 237.

The register 232 may receive a target voltage ($V_{set}$) of the alternator 200, a slope variable threshold duty cycle, and a slope corresponding to an arrival speed of a target PWM duty cycle from the ECU 330 through the LIN communicator 231, and may temporarily store the received target voltage ($V_{set}$), slope variable threshold duty cycle, and slope of the alternator 200 therein.

An input filter 233 may receive a current output voltage of the alternator 200, and may filter out noise contained in the received output voltage.

The ADC 234 may convert the resultant current output voltage from which noise is removed by the input filter 233 into a digital signal.

The duty determiner 235 may compare the current output voltage of the alternator 200 with the target voltage ($V_{set}$) received from the ECU 330, and may thus decide a target PWM duty cycle of the output current applied to the rotor electromagnet 212 according to the result of comparison.

The slope controller 236 may receive not only the target PWM duty cycle decided by the duty determiner 235 but also a real-time slope value and slope variable threshold duty cycle received from the ECU 330 through LIN communication, and may thus output a final PWM duty cycle. Therefore, the slope controller 236 may control the speed (slope) arriving at the target PWM duty cycle at the current PWM duty cycle.

In more detail, the slope controller 236 may compare a current PWM duty cycle with the slope variable threshold duty cycle. When the current PWM duty cycle is higher than the slope variable threshold duty cycle, the slope controller 236 may output the final PWM duty cycle according to a speed (i.e., the slope value) arriving at the target PWM duty cycle.

The slope variable threshold duty cycle is a threshold value at which the PWM duty cycle may be slowly changed to prevent overload from occurring in the engine when there is a large difference between the target PWM duty cycle and the current PWM duty cycle. The slope variable threshold duty cycle may be variably decided according to a difference between the target PWM duty cycle and the current PWM duty cycle.

Therefore, when the current PWM duty cycle is less than the slope variable threshold duty cycle, the slope controller 236 may use an initial slope value received from the ECU 330 to prevent overload from occurring in the engine 300. When the current PWM duty cycle is higher than the slope variable threshold duty cycle, the slope controller 236 according to lapse of time, the slope controller 236 may change the slope according to a real-time slope value, such that the slope controller 236 may freely control the target PWM duty cycle (i.e., a time arriving at the target voltage) after initial stabilization of the engine 300. In this case, the real-time slope value may be a speed arriving at the target PWM duty cycle, and the real-time slope value corresponding to the speed may be acquired from the ECU 330 on the basis of a lookup table. Accordingly, the slope controller 236 may receive the slope value from the ECU 330, may control an arrival time of the target voltage, and may thus improve a response speed of the output voltage of the alternator 200.

The output driver 237 may change the final PWM duty cycle according to the slope decided by the slope controller 236, and may thus output a current to be applied to the rotor electromagnet 212.

A method for changing the speed arriving at the target PWM duty cycle (i.e., the slope) will hereinafter be described with reference to FIGS. 5 to 8.

Figure 5:
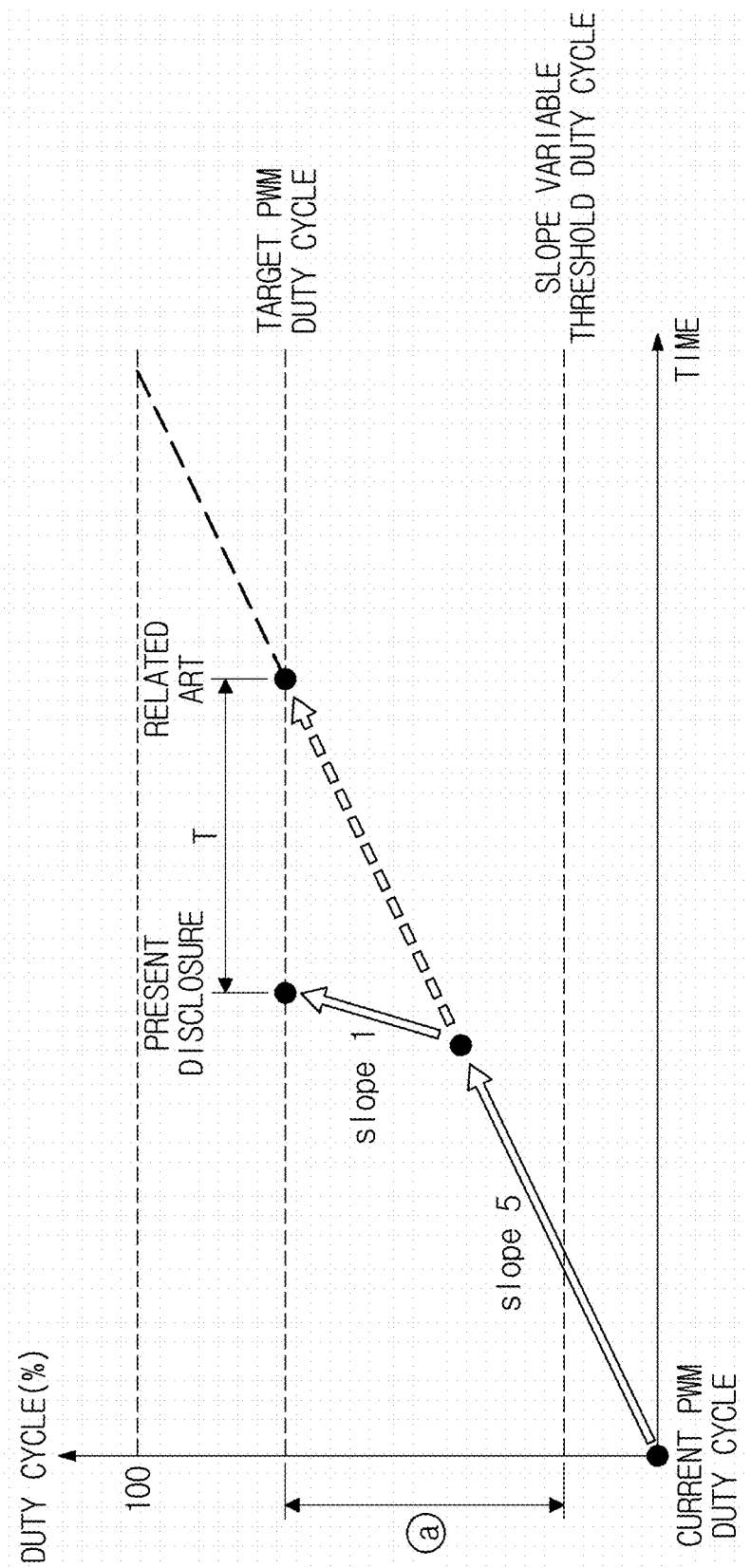
FIG. 5 is a view illustrating a first graph for variably controlling the speed arriving at a target voltage of an alternator regulator of a vehicle.

FIG. 5 is a view illustrating a first graph for variably controlling the speed arriving at a target voltage of an alternator regulator of a vehicle according to an embodiment of the present disclosure.

Referring to FIG. 5, the regulator compares a target PWM duty cycle with a current PWM duty cycle. When there is a large difference between the target PWM duty cycle and the current PWM duty cycle, the regulator may control the output PWM duty cycle at a fifth slope (Slope 5) such that the regulator may slowly change the PWM duty cycle without overloading the engine. Thereafter, when the current PWM duty cycle is higher than the slope variable threshold duty cycle, the regulator may control the output PWM duty cycle by changing a slope value to a first slope (Slope 1) so as to rapidly arrive at the target PWM duty cycle. In this case, the slope may be changed only in a specific region □.

As can be seen from FIG. 5, according to a related art, when a slope received from the ECU 330 is selected once, the output PWM duty cycle is controlled at the fifth slope (Slope 5) in so far as the target PWM duty cycle is not changed. In contrast, according to embodiments of the present disclosure, while the slope is controlled at the fifth slope (Slope 5) before the current PWM duty cycle is higher than the slope variable threshold duty cycle, when the current PWM duty cycle is higher than the slope variable threshold duty cycle, the slope is changed to the first slope (Slope 1), a time (T) arriving at the target PWM duty cycle, i.e., the speed arriving at the target voltage, is shortened, such that a response speed of the output voltage of the alternator 200 can be improved.

Figure 6:
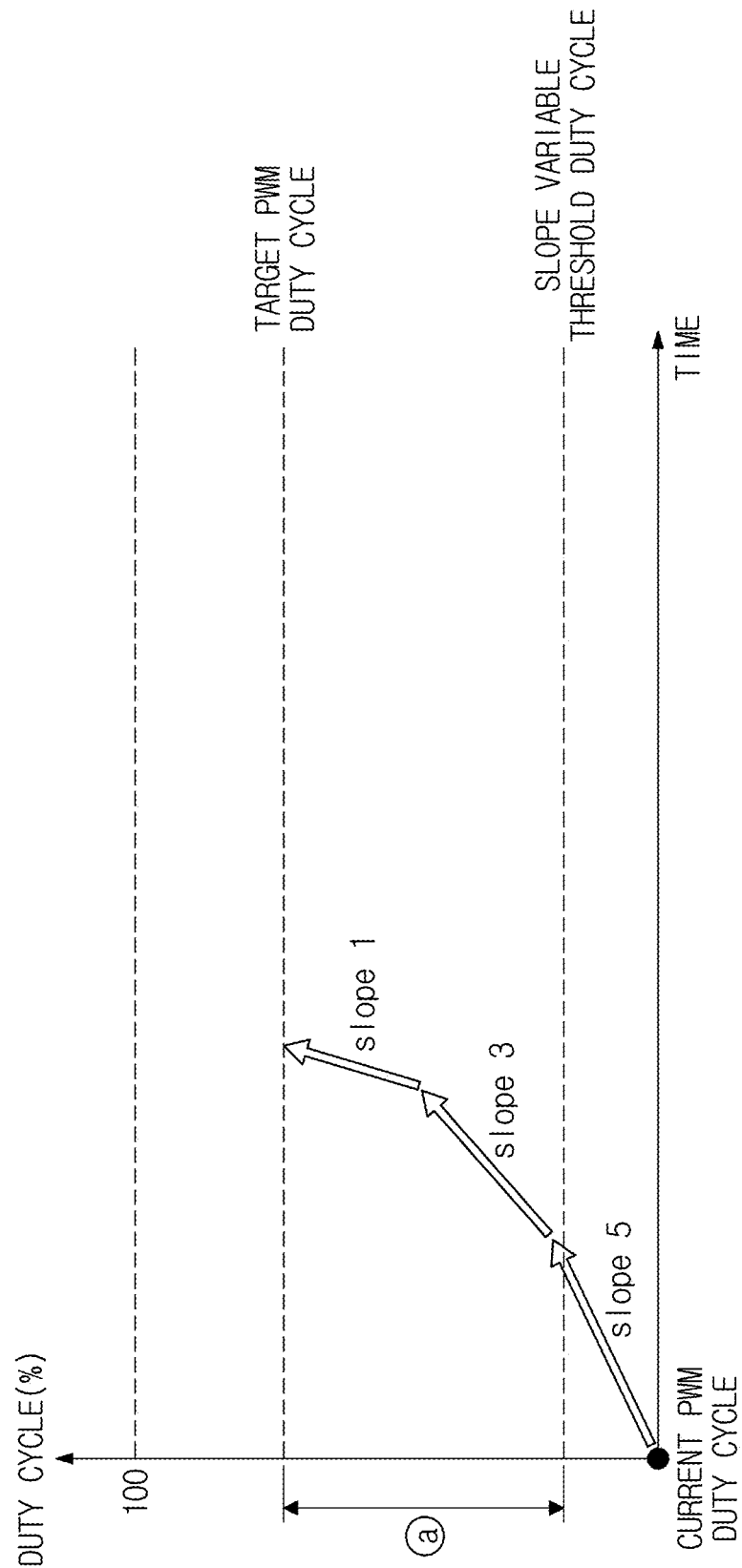
FIG. 6 is a view illustrating a second graph for variably controlling the speed arriving at a target voltage of an alternator regulator of a vehicle according to an embodiment of the present disclosure.

FIG. 6 is a view illustrating a second graph for variably controlling the speed arriving at a target voltage of an alternator regulator of a vehicle according to an embodiment of the present disclosure.

Referring to FIG. 6, when there is a large difference between the target PWM duty cycle and the current PWM duty cycle according to the result of comparison between the target PWM duty cycle and the current PWM duty cycle, the output PWM duty cycle is controlled at the fifth slope (Slope 5) in the same manner as in FIG. 5, such that the PWM duty cycle is slowly changed. Thereafter, when the current PWM duty cycle is higher than the slope variable threshold duty cycle, the slope is freely changed to the other slope (Slope 3 or Slope 2), such that the slope may be controlled to rapidly arrive at the target PWM duty cycle.

Figure 7:
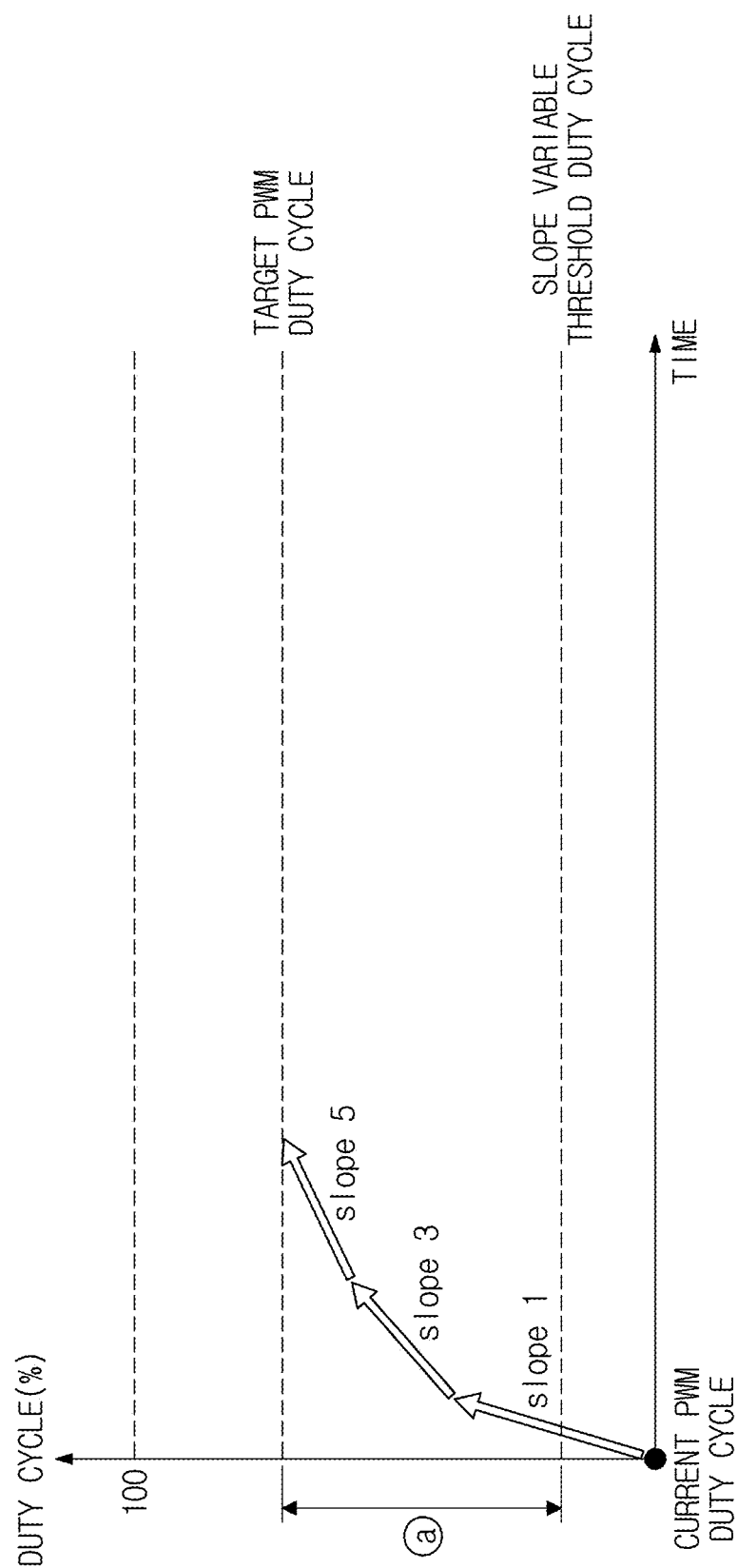
FIG. 7 is a view illustrating a third graph for variably controlling the speed arriving at a target voltage of an alternator regulator of a vehicle according to an embodiment of the present disclosure.

FIG. 7 is a view illustrating a third graph for variably controlling the speed arriving at a target voltage of an alternator regulator of a vehicle according to an embodiment of the present disclosure.

Referring to FIG. 7, the slope is controlled at the first slope (Slope 1) before the current PWM duty cycle is higher than the slope variable threshold duty cycle, so that the PWM duty cycle may be rapidly changed. Thereafter, when the current PWM duty cycle is higher than the slope variable threshold duty cycle, the slope is freely changed to the other slope (Slope 3 or Slope 5), such that a time (T) arriving at the target PWM duty cycle may be freely controlled.

Figure 8:
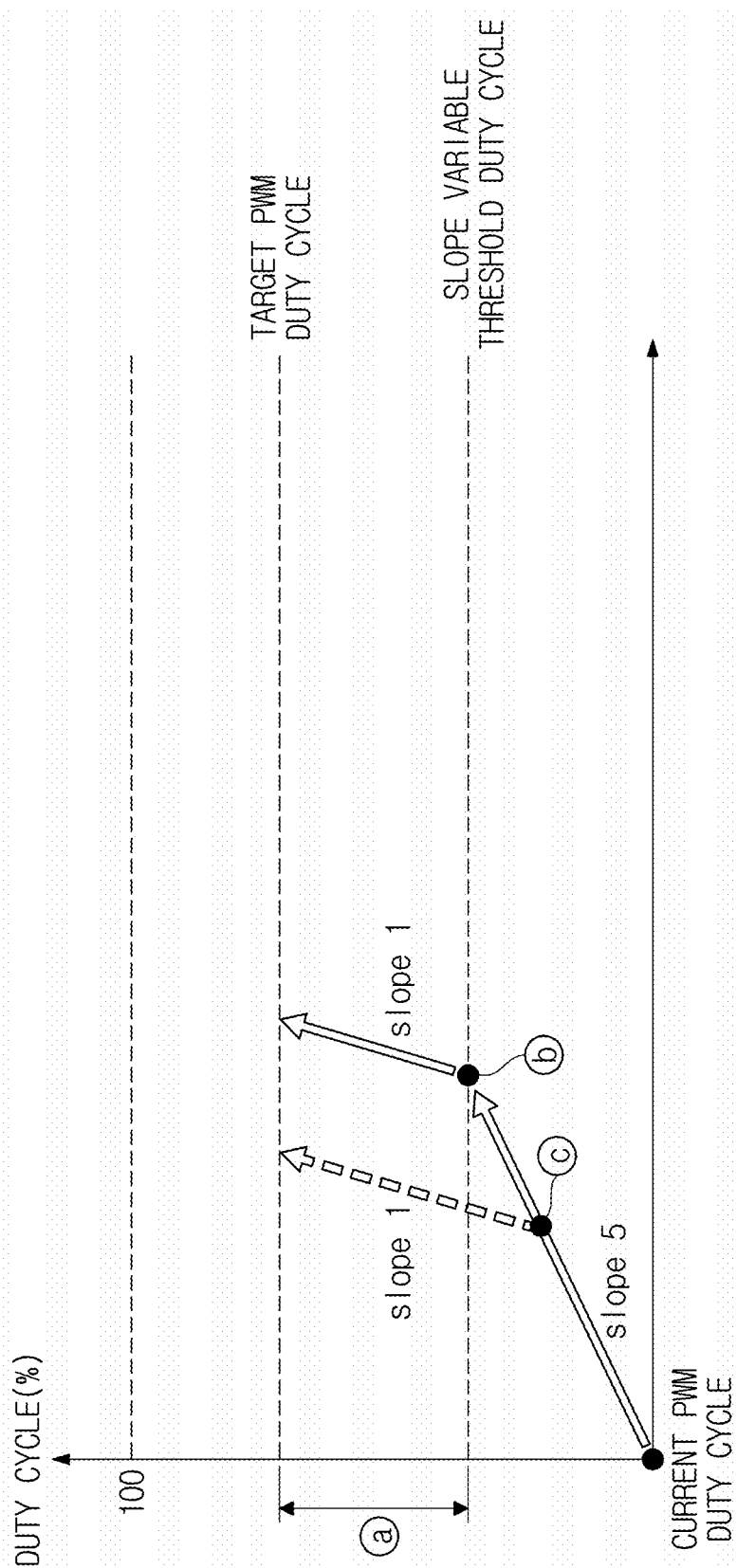
FIG. 8 is a view illustrating a fourth graph for variably controlling the speed arriving at a target voltage of an alternator regulator of a vehicle according to an embodiment of the present disclosure.
Figure 9:
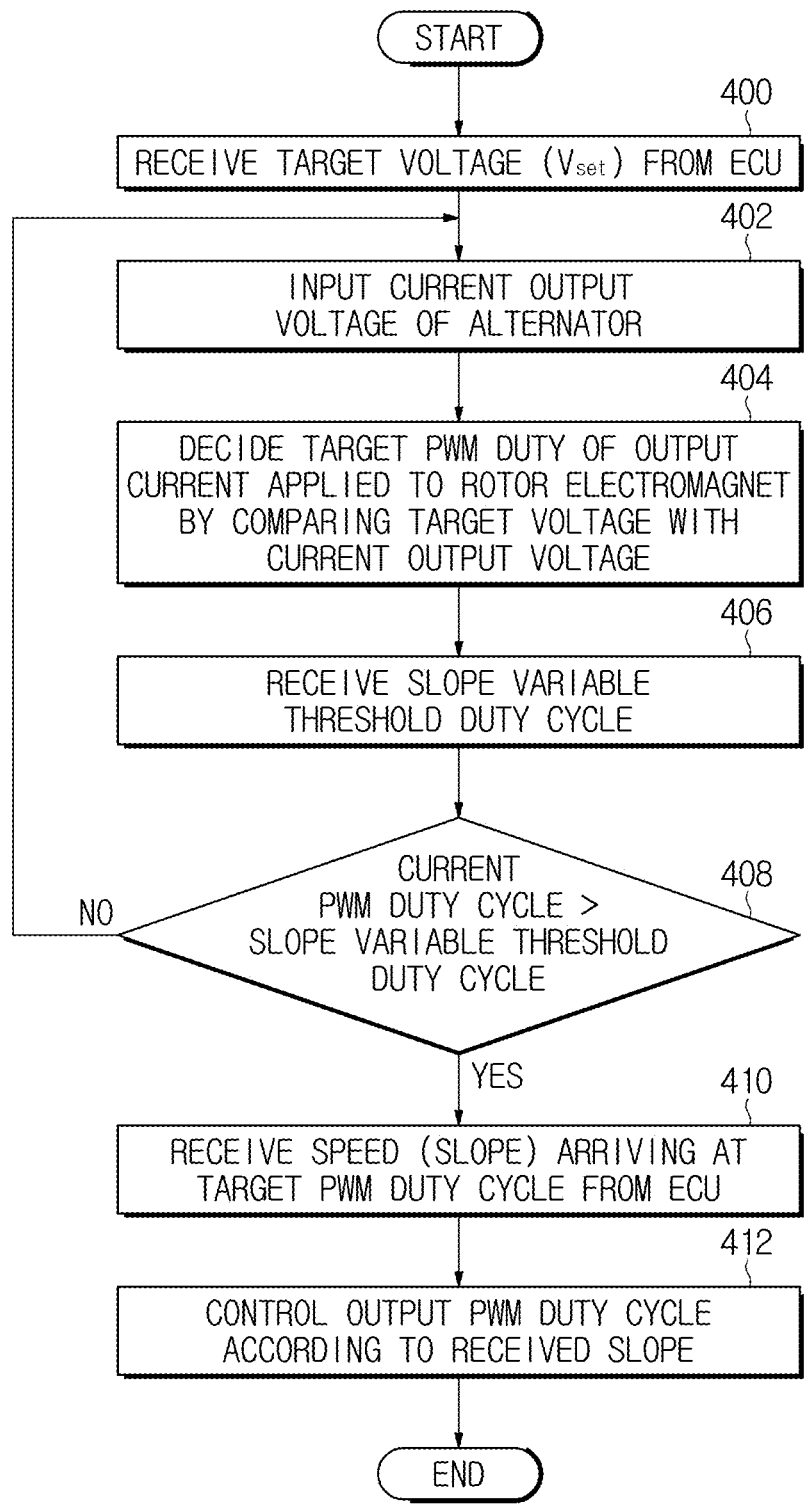
FIG. 9 is a flowchart illustrating a vehicle alternator control algorithm according to an embodiment of the present disclosure.

FIG. 8 is a view illustrating a fourth graph for variably controlling the speed arriving at a target voltage of an alternator regulator of a vehicle according to an embodiment of the present disclosure. a FIG. 9 is a flowchart illustrating a vehicle alternator control algorithm according to an embodiment of the present disclosure.

Referring to FIG. 9, a duty determiner 235 of the regulator 230 may receive a target voltage ($V_{set}$) from the ECU 330 through LIN communication (400).

Subsequently, the duty determiner 235 may receive a current output voltage of the alternator 200 (402), may compare a target voltage ($V_{set}$) received from the ECU 330 with a current output voltage of the alternator 200, and may determine a target PWM duty cycle of an output current applied to the rotor electromagnet 212 (404).

The slope controller 236 may receive the slope variable threshold duty cycle from the ECU 330 through LIN communication (406).

Subsequently, the slope controller 236 may determine whether the current PWM duty cycle is higher than the slope variable threshold duty cycle (408).

When the current PWM duty cycle is not higher than the slope variable threshold duty cycle (408), the slope controller 236 goes back to operation 402 such that the slope controller 236 may again receive the current output voltage of the alternator (402).

When the current PWM duty cycle is higher than the slope variable threshold duty cycle (408), the slope controller 236 may receive a slope indicating a speed arriving at the target PWM duty cycle from the ECU 330 through LIN communication (410).

Subsequently, the slope controller 236 may control the output PWM duty cycle according to the received slope (412).

As is apparent from the above description, the apparatus and method for controlling an alternator of a vehicle according to a certain embodiments of the present disclosure may use a slope initially received from an ECU to prevent overload from occurring in an engine when a current PWM duty cycle is less than a slope variable duty cycle, may freely change the slope when the current PWM duty cycle is higher than the slope variable duty cycle after lapse of a time, may flexibly suppress engine RPM fluctuation and vibration in real time, and may improve a response speed of an alternator output voltage.

Logical blocks, modules or units described in connection with embodiments disclosed herein can be implemented or performed by a computing device having at least one processor, at least one memory and at least one communication interface. The elements of a method, process, or algorithm described in connection with embodiments disclosed herein can be embodied directly in hardware, in a software module executed by at least one processor, or in a combination of the two. Computer-executable instructions for implementing a method, process, or algorithm described in connection with embodiments disclosed herein can be stored in a non-transitory computer readable storage medium.

Although a few embodiments of the present disclosure have been shown and described, it would be appreciated by those skilled in the art that changes may be made in these embodiments without departing from the principle and spirit of the invention, the scope of which is defined in the claims and their equivalents.

What is claimed is:

1. An apparatus for controlling an alternator of a vehicle comprising:
    an alternator configured to generate electricity using rotational force of an engine; and
    a regulator configured to control a current output voltage of the alternator at a target voltage,
    wherein the regulator
    is further configured to determine a target pulse-width modulation (PWM) duty cycle by calculating a difference between the target voltage and a voltage of the alternators, and
    control a slope indicating a speed arriving at the target PWM duty cycle at a current PWM duty cycle.

2. The apparatus according to claim 1, wherein the regulator receives a threshold duty cycle capable of changing the slope and a real-time slope value from an electronic control unit (ECU) through Local Interconnect Network (LIN) communication.

3. The apparatus according to claim 2, wherein the regulator changes a current PWM duty cycle according to the slope value received from the ECU.

4. The apparatus according to claim 3, wherein the regulator compares the current PWM duty cycle with the threshold duty cycle duty cycle, and uses an initially-established slope received from the ECU when the current PWM duty cycle is less than the threshold duty cycle.

5. The apparatus according to claim 4, wherein the regulator changes a final PWM duty cycle outputting a current applied to a rotor electromagnet, using the initially-established slope.

6. The apparatus according to claim 3, wherein the regulator compares the current PWM duty cycle with the threshold duty cycle, and changes the slope when the current PWM duty cycle is higher than the threshold duty cycle.

7. The apparatus according to claim 6, wherein the regulator changes a final PWM duty cycle outputting a current applied to a rotor electromagnet, using the changed slope.

8. The apparatus according to claim 3, wherein the regulator receives a plurality of slope values from the ECU, and changes a PWM duty cycle according to the received slope values in real time.

9. The apparatus according to claim 1, wherein the regulator outputs a current applied to a rotor electromagnet by controlling an output PWM duty cycle according to the slope.

10. A method for controlling an alternator of a vehicle configured to generate electricity using rotational force of an engine comprising:
   receiving a target voltage from an electronic control unit (ECU);
   determining a target pulse-width modulation (PWM) duty cycle by comparing a current output voltage of the alternator with the target voltage;
   receiving a threshold duty cycle from the ECU;
   comparing a current PWM duty cycle with the threshold duty cycle; and
   controlling a slope indicating a speed arriving at the target PWM duty cycle when the current PWM duty cycle is higher than the threshold duty cycle.

11. The method according to claim 10, wherein the threshold duty cycle is a threshold value for changing a slope of the current PWM duty cycle according to a slope value received from the ECU.

12. The method according to claim 11, wherein the controlling the slope includes:
   changing the slope of the current PWM duty cycle according to lapse of time.

13. The method according to claim 12, further comprising:
   arriving at the target PWM duty cycle using the slope changed according to lapse of time.

14. The method according to claim 10, further comprising:
   when the current PWM duty cycle is less than the threshold duty cycle, arriving at the target PWM duty cycle using an initially-established slope from the ECU.

* * * * *